(12) United States Patent
Kim

(10) Patent No.: US 9,859,490 B2
(45) Date of Patent: Jan. 2, 2018

(54) ELECTRONIC DEVICE INCLUDING A SEMICONDUCTOR MEMORY HAVING MULTI-LAYERED STRUCTURAL FREE LAYER

(71) Applicant: SK hynix Inc., Icheon-Si (KR)

(72) Inventor: Jeong-Myeong Kim, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 46 days.

(21) Appl. No.: 14/918,356

(22) Filed: Oct. 20, 2015

(65) Prior Publication Data

US 2016/0308121 A1    Oct. 20, 2016

(30) Foreign Application Priority Data

Apr. 14, 2015   (KR) .................. 10-2015-0052578

(51) Int. Cl.
| | |
|---|---|
| *G11C 11/16* | (2006.01) |
| *H01L 43/08* | (2006.01) |
| *H01L 43/02* | (2006.01) |
| *G06F 3/06* | (2006.01) |

(Continued)

(52) U.S. Cl.
CPC ............ *H01L 43/08* (2013.01); *G06F 3/0604* (2013.01); *G06F 3/0629* (2013.01); *G06F 3/0688* (2013.01); *G06F 12/0802* (2013.01); *G06F 13/4068* (2013.01); *G11C 11/161* (2013.01);

(Continued)

(58) Field of Classification Search
CPC ....... G11C 11/161; G11C 11/16; H01L 43/08; H01L 43/12
See application file for complete search history.

(56) References Cited

U.S. PATENT DOCUMENTS

| 6,114,719 A | 9/2000 | Dill et al. | |
|---|---|---|---|
| 7,046,489 B2 * | 5/2006 | Kamiguchi ............ | B82Y 10/00 360/324.1 |

(Continued)

FOREIGN PATENT DOCUMENTS

| KR | 1020030000137 A | 1/2003 |
|---|---|---|
| KR | 1020030054175 A | 7/2003 |

(Continued)

OTHER PUBLICATIONS

U.S. Non-Final Office Action issued for U.S. Appl. No. 14/295,229, dated Oct. 11, 2016 (23 pages).

(Continued)

*Primary Examiner* — Huan Hoang
*Assistant Examiner* — Roberto Mancera, Jr.
(74) *Attorney, Agent, or Firm* — Perkins Coie LLP

(57) ABSTRACT

This technology provides an electronic device. An electronic device in accordance with an implementation of this document includes semiconductor memory, and the semiconductor memory includes a free layer having a variable magnetization direction; a pinned layer having a pinned magnetization direction; and a tunnel barrier layer interposed between the pinned layer and the free layer, wherein the free layer includes: a first ferromagnetic material; a second ferromagnetic material having a coercive force smaller than that of the first ferromagnetic material; and an amorphous spacer interposed between the first ferromagnetic material and the second ferromagnetic material.

20 Claims, 6 Drawing Sheets

(51) Int. Cl.
*G06F 12/0802* (2016.01)
*G06F 13/40* (2006.01)

(52) U.S. Cl.
CPC .......... *H01L 43/02* (2013.01); *G06F 2212/60* (2013.01)

(56) References Cited

U.S. PATENT DOCUMENTS

| | | | |
|---|---|---|---|
| 8,084,835 B2* | 12/2011 | Ranjan | B82Y 10/00 257/421 |
| 9,130,155 B2* | 9/2015 | Chepulskyy | H01L 43/08 |
| 2002/0146895 A1 | 10/2002 | Ramdani et al. | |
| 2006/0098354 A1 | 5/2006 | Parkin | |
| 2006/0261425 A1 | 11/2006 | Suemitsu et al. | |
| 2007/0076471 A1 | 4/2007 | Kano et al. | |
| 2007/0187785 A1* | 8/2007 | Hung | H01L 43/12 257/421 |
| 2007/0297220 A1 | 12/2007 | Yoshikawa et al. | |
| 2010/0074092 A1 | 3/2010 | Zhu et al. | |
| 2010/0080048 A1 | 4/2010 | Liu et al. | |
| 2011/0089507 A1 | 4/2011 | Mao | |
| 2011/0198756 A1 | 8/2011 | Thenappan et al. | |
| 2011/0228223 A1 | 9/2011 | Jiao et al. | |
| 2011/0248235 A1 | 10/2011 | Jeong et al. | |
| 2011/0297646 A1 | 12/2011 | deVillers et al. | |
| 2012/0092923 A1 | 4/2012 | Bedeschi et al. | |
| 2012/0326252 A1 | 12/2012 | Yamakawa et al. | |
| 2013/0005151 A1 | 1/2013 | Chen et al. | |
| 2013/0043530 A1 | 2/2013 | Kim et al. | |
| 2013/0052826 A1 | 2/2013 | Nepomnishy et al. | |
| 2013/0119494 A1 | 5/2013 | Li et al. | |
| 2013/0134534 A1* | 5/2013 | Sbiaa | G11C 11/16 257/421 |
| 2013/0161768 A1 | 6/2013 | Khvalkovskiy et al. | |
| 2013/0248798 A1 | 9/2013 | Yi et al. | |
| 2013/0258763 A1 | 10/2013 | Ranjan et al. | |
| 2014/0242418 A1* | 8/2014 | Shukh | G11C 11/161 428/811.1 |
| 2014/0247648 A1 | 9/2014 | Yoon | |
| 2014/0327095 A1 | 11/2014 | Kim et al. | |
| 2014/0365688 A1 | 12/2014 | Lee et al. | |
| 2015/0092480 A1 | 4/2015 | Choi et al. | |
| 2015/0162526 A1 | 6/2015 | Lee et al. | |
| 2015/0249206 A1 | 9/2015 | Kim et al. | |
| 2015/0357557 A1* | 12/2015 | Kim | G06F 12/0802 711/103 |
| 2016/0157715 A1 | 6/2016 | De Boer et al. | |
| 2016/0180905 A1 | 6/2016 | Kim et al. | |
| 2017/0069837 A1 | 3/2017 | Choi et al. | |

FOREIGN PATENT DOCUMENTS

| | | |
|---|---|---|
| KR | 1020040005472 A | 1/2004 |
| KR | 1020060000878 A | 1/2006 |
| KR | 100641500 B1 | 10/2006 |
| KR | 10-2006-0118311 A | 11/2006 |
| KR | 10-2007-0036704 A | 4/2007 |
| KR | 10-2007-0054551 A | 5/2007 |
| KR | 10-2009-038809 A | 4/2009 |
| KR | 1020100005449 A | 1/2010 |
| KR | 1020100030054 A | 3/2010 |
| KR | 1020100128219 A | 12/2010 |
| KR | 101073132 B1 | 6/2011 |
| KR | 1020120047356 A | 5/2012 |
| KR | 1020120058113 A | 6/2012 |
| KR | 10-2012-0078631 A | 7/2012 |
| KR | 1020130069097 A | 6/2013 |
| KR | 1020140011138 A | 1/2014 |
| KR | 1020140025165 A | 3/2014 |

OTHER PUBLICATIONS

U.S. Final Office Action issued for U.S. Appl. No. 14/158,702, dated Dec. 23, 2015 (10 pages).
U.S. Non-Final Office Action issued for U.S. Appl. No. 14/158,702, dated Jul. 17, 2015 (16 pages).
U.S. Notice of Allowance and Fees Due for U.S. Appl. No. 14/229,745, dated Oct. 3, 2014 (12 pages).
U.S. Non-Final Office Action issued for U.S. Appl. No. 14/295,229, dated May 22, 2015 (14 pages).
U.S. Non-Final Office Action issued for U.S. Appl. No. 14/621,646, dated Sep. 15, 2016 (10 pages).
USPTO Non-Final Office Action issued for U.S. Appl. No. 14/295,229, dated Sep. 27, 2017 (24 pages).
USPTO Notice of Allowance issued for U.S. Appl. No. 14/846,812, dated Sep. 21, 2017 (20 pages).

* cited by examiner

ELECTRONIC DEVICE INCLUDING A SEMICONDUCTOR MEMORY HAVING MULTI-LAYERED STRUCTURAL FREE LAYER

CROSS-REFERENCE TO RELATED APPLICATION

This patent document claims priority of Korean Patent Application No. 10-2015-0052578, entitled "ELECTRONIC DEVICE" and filed on Apr. 14, 2015, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element.

In one aspect, an electronic device is provided to include semiconductor memory, and the semiconductor memory includes a free layer having a variable magnetization direction; a pinned layer having a pinned magnetization direction; and a tunnel barrier layer interposed between the pinned layer and the free layer, wherein the free layer includes: a first ferromagnetic material; a second ferromagnetic material having a coercive force smaller than that of the first ferromagnetic material; and an amorphous spacer interposed between the first ferromagnetic material and the second ferromagnetic material.

Implementations of the above electronic device may include one or more the following.

The first ferromagnetic material has a thickness to provide a perpendicular magnetization direction. The second ferromagnetic material has a thickness greater than that of the first ferromagnetic material. The thickness of the second ferromagnetic material is about 1.5 nm or more. The first ferromagnetic material and the second ferromagnetic material have a same magnetization direction to each other. The amorphous spacer includes a conductive material. The first ferromagnetic material and the second ferromagnetic material have different lattice structures from each other. The semiconductor memory further includes a layer disposed under the free layer and including a light metal.

In another aspect, an electronic device is provided to include semiconductor memory that includes an under layer including a light metal; a free layer disposed over the under layer and having a variable magnetization direction; a tunnel barrier layer disposed over the free layer; and a pinned layer disposed over the tunnel barrier layer and having a pinned magnetization direction, wherein the free layer is a composite structure which includes: a first ferromagnetic material having a first magnetization that can be switched by spin torque transfer; and a second ferromagnetic material disposed over the first ferromagnetic material and having a coercive force smaller than that of the first ferromagnetic material, wherein exchange coupling between the first and second ferromagnetic materials is allowed so that a magnetization of the second ferromagnetic material is aligned to a magnetization of the first ferromagnetic material and changes with the magnetization of the first ferromagnetic material.

Implementations of the above electronic device may include one or more the following.

The first ferromagnetic material has a thickness to provide a perpendicular magnetization direction. The second ferromagnetic material has a thickness greater than that of the first ferromagnetic material. The thickness of the second ferromagnetic material is about 1.5 nm or more. The first ferromagnetic material and the second ferromagnetic material have a same magnetization direction to each other. The free layer further includes: an amorphous spacer interposed between the first ferromagnetic material and the second ferromagnetic material. The amorphous spacer includes a conductive material. The first ferromagnetic material and the second ferromagnetic material have different lattice structures from each other.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, an electronic device is provided to comprise semiconductor memory, wherein the semiconductor memory includes: a free layer having a variable magnetization that is perpendicular to the free layer and is changeable; a pinned layer having a pinned magnetization that is perpendicular to the pinned layer; and a tunnel barrier layer interposed between the pinned layer and the free layer, wherein the free layer includes two magnetic layers that are exchange coupled to each other to have a common magnetization direction perpendicular to the free layer.

In some implementations, the two layers includes a first layer and a second layer, the second layer formed closer to the pinned layer than the first layer, and the second layer has a coercive force smaller than that of the first layer. In some implementations, the second layer has a greater thickness than the first layer. In some implementations, the electronic device further includes an underlying layer formed under the free layer and includes a light metal.

These and other aspects, implementations and associated advantages are described in greater detail in the drawings, the description and the claims.

DETAILED DESCRIPTION

Figure 1:
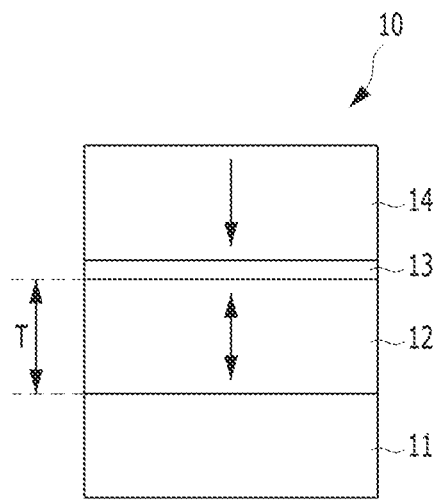
FIG. 1 is a cross-sectional view illustrating a variable resistance element of a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to explaining implementations, a variable resistance element of a comparative example will be described.

FIG. 1 is a cross-sectional view illustrating a variable resistance element of a comparative example.

Referring to FIG. 1, a variable resistance element 10 of a comparative example may include an MTJ (Magnetic Tunnel Junction) structure which includes a free layer 12 having a variable magnetization direction, a pinned layer 14 having a pinned magnetization direction, and a tunnel barrier layer 13 interposed between the free layer 12 and the pinned layer 14.

Since the magnetization direction of the free layer 12 is variable, the free layer 12 may store different data according to its magnetization direction, and be referred to as a storage layer, etc.

The magnetization direction of the pinned layer 14 is pinned to be compared with the free layer 12, and be referred to as a reference layer, etc.

According to a voltage or current applied to the variable resistance element 10, the magnetization direction of the free layer 12 may be changed so as to be parallel or anti-parallel to the magnetization direction of the pinned layer 14. As a result, the variable resistance element 10 may be switched between a low resistance state and a high resistance state to store different data. By doing so, the variable resistance element 10 may serve as a memory cell.

Each of the free layer 12 and the pinned layer 14 may have a single-layered structure or a multi-layered structure including a magnetic material. The magnetization direction of the free layer 12 may be changed by spin transfer torque. Also, the magnetization directions of the free layer 12 and the pinned layer 14 may be perpendicular to top surfaces of the free layer 12 and the pinned layer 14, respectively. For example, as shown by arrows, the magnetization direction of the free layer 12 may be changed to be either a downward direction or an upward direction, and the magnetization direction of the pinned layer 14 may be fixed to an upward direction.

The tunnel barrier layer 13 may include an insulating oxide, and change the magnetization direction of the free layer 12 by tunneling of electrons during a writing operation.

The variable resistance element 10 may further include one or more additional layers performing various functions to improve a characteristic of the MTJ structure. For example, the variable resistance element 10 may further include an under layer 11 which is disposed under the MTJ structure and helps the MTJ structure to improve its characteristic. The under layer 11 may include a metal.

Meanwhile, when the free layer 12 and the pinned layer 14 have a single-layered structure, the free layer 12 and the pinned layer 14 needs to have a sufficiently small thickness to have a perpendicular magnetization direction. This is because the magnetization direction of a single magnetic layer tends to become closer to a horizontal direction as a thickness of the single magnetic layer increases.

However, when a thickness T of the free layer 12 is small, the metal of the under layer 11 may pass through the free layer 12 and be diffused into the tunnel barrier layer 13 or the pinned layer 14. The diffused metal may be trapped in the tunnel barrier layer 13 and/or the pinned layer 14, and form a kind of leakage path. As a result, the diffused metal may cause undesired operations of the variable resistance element 10.

On the other hand, if the thickness T of the free layer 12 increases, it is difficult to maintain a perpendicular magnetization direction of the free layer 12. That is, an MTJ structure having a perpendicular magnetization characteristic cannot be implemented.

Figure 2:
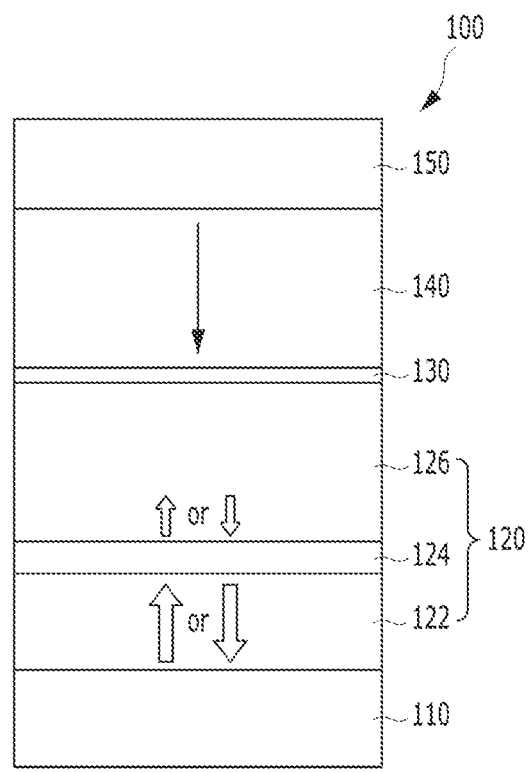
FIG. 2 is a cross-sectional view illustrating an exemplary variable resistance element in accordance with an implementation of the present disclosure.

In some implementations, the disclosed technology provides a memory device including a free layer with improved characteristics. According to the disclosed technology, the free layer has a large thickness but maintains a perpendicular magnetization direction. Thus, it is possible to solve the problem due to the small thickness of the free layer while achieving the perpendicular magnetization direction. FIG. 2 is a cross-sectional view illustrating a variable resistance element in accordance with an implementation of the present disclosure.

Referring to FIG. 2, a variable resistance element 100 in accordance with an implementation may include an MTJ (Magnetic Tunnel Junction) structure which includes a free layer 120 having a variable magnetization direction, a pinned layer 140 having a pinned magnetization direction, and a tunnel barrier layer 130 interposed between the free layer 120 and the pinned layer 140.

Here, the magnetization direction of the free layer 120 may be changed by spin transfer torque. The free layer 120 may include a first ferromagnetic material 122 of a hard type having a relatively large coercive force and a second ferromagnetic material 126 of a soft type having a relatively small coercive force. The second ferromagnetic material 126 may be formed over the first ferromagnetic material 122. The first ferromagnetic material 122 may be formed of or include FePt, FePd, SmCo, Tb, Bi, Co/Pt, or Co/Pd, etc., and may have a small thickness to have a perpendicular magnetization direction. The second ferromagnetic material 126 may be formed of or include a material which has a coercive force smaller than that of the first ferromagnetic material 122. For example, the second ferromagnetic material 126 may be formed of or include Co, Ni, Fe, CoFeB, or CoFeGe, etc. The second ferromagnetic material 126 may have a greater thickness than the first ferromagnetic material 122. Specially, the second ferromagnetic material 126 may be thick enough not to have a perpendicular magnetization characteristic by itself but will have a perpendicular magnetization when exchange coupled to the first ferromagnetic material 122. For example, a thickness of the second ferromagnetic material 126 may be about 1.5 nm or more. Although the second ferromagnetic material 126 is thick and thus has a non-perpendicular magnetization characteristic by itself, the first ferromagnetic material 112 having a large coercive force operate to allow the second ferromagnetic material 126 to have a perpendicular magnetization characteristic by an exchange coupling between the first and second ferromagnetic materials 122 and 126. Due to this exchange coupling between the first and second ferromagnetic materials, a magnetization of the second ferromagnetic material, which may be at a direction different from the magnetization of the first ferromagnetic material, is aligned to the magnetization of the first ferromagnetic material and will change with or follow the magnetization of the first ferromagnetic material as the first ferromagnetic material changes its magnetization direction, e.g., due to a spin torque transfer operation by a spin polarized current passing through the first ferromagnetic material. For example, as shown by arrows of FIG. 2, when the first ferromagnetic material 122 has an upward magnetization direction, the second ferromagnetic material 126 may have a magnetization direction in the same direction as that of the first ferromagnetic material 122, that is, an upward magnetization direction by an exchange coupling with the first ferromagnetic material 122. For example, this exchange coupling can be based on a spring magnet mechanism in the composite material structure of the first and second ferromagnetic materials 122 and 126. On the other hand, when the first ferromagnetic material 122 has a downward magnetization direction, the second ferromagnetic material 126 may have a magnetization direction same as that of the first ferromagnetic material 122, that is, a downward magnetization direction by an exchange coupling with a spring magnet mechanism. That is, the free layer 120 including the first and second ferromagnetic materials 122 and 126 can operate as a single magnetic dipole.

Moreover, the free layer 120 may further include a spacer 124 interposed between the first ferromagnetic material 122 and the second ferromagnetic material 126. The spacer 124 may be structured to address the technical issue of a lattice structure difference and a lattice mismatch between the first ferromagnetic material 122 and the second ferromagnetic material 126. In some implementations, the spacer 124 may be amorphous. The spacer 124 may include a conductive material, for example, a metal, a metal nitride, or a metal oxide, etc.

The pinned layer 140 may have a single-layered structure or a multi-layered structure including a ferromagnetic material. For example, the pinned layer 140 may include an alloy including Fe, Ni or Co, such as an Fe—Pt alloy, an Fe—Pd alloy, a Co—Pd alloy, a Co—Pt alloy, an Fe—Ni—Pt alloy, a Co—Fe—Pt alloy, or a Co—Ni—Pt alloy, etc. Alternately, for example, the pinned layer 140 may include a stack structure including Co/Pt, or Co/Pd, etc. The pinned layer 140 may have a magnetization direction perpendicular to a top surface of the pinned layer 140, for example, a downward magnetization direction.

The tunnel barrier layer 130 may include an insulating oxide, for example, MgO, CaO, SrO, TiO, VO, or NbO, etc. The tunnel barrier layer 130 may change the magnetization direction of the free layer 120 by tunneling of electrons during a writing operation.

Furthermore, the variable resistance element 100 may further include one or more additional layers performing various functions to improve a characteristic of the MTJ structure and facilitate manufacturing processes. For example, the variable resistance element 100 may further include an under layer 110 disposed under the MTJ structure, or an upper layer 150 disposed over the MTJ structure, etc.

In this implementation, the under layer 110 may include a light metal. In this case, the under layer 110 may serve to reduce a damping constant α of the free layer 120 and improve a perpendicular anisotropy. Since a current density required for spin transfer torque is proportional to a damping constant, it is desirable to reduce the damping constant of the free layer 120. That is, it is possible to easily change the magnetization direction of the free layer 120 with a low current as the damping constant of the free layer 120 decreases, thereby improving a switching characteristic of the variable resistance element 100. However, since most of magnetic materials having a strong perpendicular anisotropy have a large damping constant, it is difficult to satisfy an improvement in a perpendicular anisotropy of the free layer 120 and a decrease in a damping constant of the free layer 120 at the same time. However, by using a light metal as the under layer 110, it is possible to achieve the both, i.e., maintaining a perpendicular anisotropy of the free layer 120 and reducing a damping constant of the free layer 120. Here, the light metal may include a titanium and/or a metal having a specific gravity lower than that of the titanium, for example, an aluminum, etc.

The upper layer 150 may serve as a hard mask during patterning of the variable resistance element 100, and include a conductive material such as a metal, etc.

Moreover, although not shown, the variable resistance element 100 may further include a magnetic correction layer which offset an influence of a stray magnetic field generated by the pinned layer 140. The magnetic correction layer may reduce an influence of a stray magnetic field of the pinned layer 140 to the free layer 120, thereby reducing and/or removing a bias magnetic field generated in the free layer 120. Alternately, the magnetic correction layer may be formed separately from the variable resistance element 1000 in a region adjacent to the variable resistance element 100.

The above implementation may be used to achieve one or more following advantages.

First, since the free layer 120 includes at least two layers, that is, the first and second ferromagnetic materials 122 and 126, and uses an exchange coupling between the first ferromagnetic material 122 which is a hard type and thin and the second ferromagnetic material 126 which is a soft type and thick, it is possible to increase the thickness of the free layer 120 and improve a perpendicular magnetization characteristic of the free layer 120 at the same time.

When the thickness of the free layer 120 increases, a metal of the under layer 110 cannot pass through the free layer 120 although the under layer 110 includes a light metal which is easily diffused. Therefore, a phenomenon that a metal passing through the free layer 120 is trapped in the tunnel barrier layer 130 and/or the pinned layer 140 to serve as a kind of leakage path may be prevented.

Also, since an increase in the thickness of the free layer 120 may increase a shape magnetic crystalline anisotropy of the free layer 120, the free layer 120 may be less affected by a sidewall damage caused by an etching process. For example, an increase in the thickness of the second ferromagnetic material 126 of the free layer 120 may improve an interface characteristic between the second ferromagnetic material 126 and the tunnel barrier layer 130, a crystalline characteristic of the second ferromagnetic material 126, and a magnetic crystalline anisotropy of the second ferromagnetic material 126. As a result, characteristics of the variable resistance element 100 can be improved while achieving, such as an increase in TMR (Tunnel magnetoresistance), a decrease in HRD (High Resistance depth), etc.

Also, since the first ferromagnetic material 122 of a hard type has a large coercive force Hc and the second ferromagnetic material 126 of a soft type has a large saturation magnetization Ms, the free layer 120 including the first and the second ferromagnetic materials 122 and 126 may have advantages of a large coercive force and a large saturation magnetization at the same time. Also, an endurance and a stability of the free layer 120 may be improved.

Also, when the spacer 124 which is amorphous is interposed between the first ferromagnetic material 122 and the second ferromagnetic material 126, problems due to a lattice structure difference between the first ferromagnetic material 122 and the second ferromagnetic material 126 can be solved.

Moreover, since it is possible to use a light metal for the under layer 110, i the damping constant of the free layer 120 can be reduced while improving the perpendicular anisotropy of the free layer 120 at the same time.

The variable resistance element 100 may be provided in plural to constitute a cell array. The cell array may include various components such as lines, or elements, etc, to drive the variable resistance element 100. This will be exemplarily described with reference to FIGS. 3 and 4.

Figure 3:
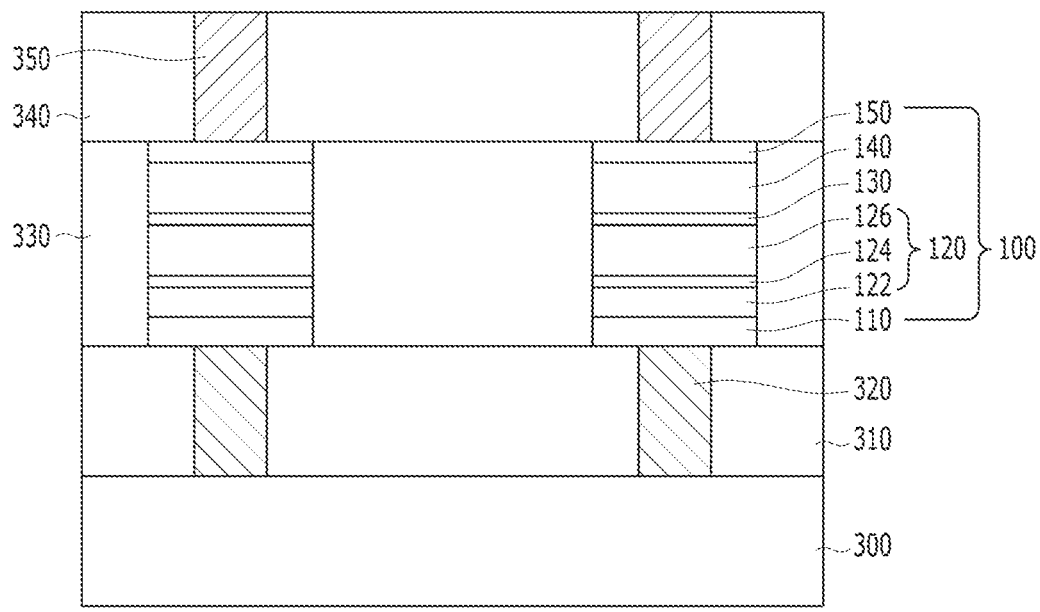
FIG. 3 is a cross-sectional view explaining a memory device in accordance with an implementation of the present disclosure.

FIG. 3 is a cross-sectional view explaining a memory device. Referring to FIG. 3, an exemplary method for fabricating the same can be also explained in accordance with an implementation of the present disclosure.

Referring to FIG. 3, the memory device of this implementation may include a substrate 300, a lower contact 320, a variable resistance element 100 and an upper contact 350. The substrate 300 may include a specific required structure (now shown), for example, a transistor for controlling an access to the variable resistance element 100. The lower contact 320 may be disposed over the substrate 300, and couple a lower end of the variable resistance element 100 with a portion of the substrate 300, for example, a drain of the transistor. The upper contact 350 may be disposed over the variable resistance element 100, and couple an upper end of the variable resistance element 100 with a certain line (not shown), for example, a bit line.

The above memory device may be fabricated by following processes.

First, the substrate 300 in which the transistor is formed may be provided, and then, a first interlayer dielectric layer 310 may be formed over the substrate 300. Then, the lower contact 320 may be formed by selectively etching the first interlayer dielectric layer 310 to form a hole exposing a portion of the substrate 300 and filling the hole with a conductive material. Then, the variable resistance element 100 may be formed by forming material layers for the variable resistance element 100 over the first interlayer dielectric layer 310 and the lower contact 320, and selectively etching the material layers. The second interlayer dielectric layer 330 may be formed by filling spaces between the variable resistance elements 100 with an insulating material. Then, a third interlayer dielectric layer 340 may be formed over the variable resistance element 100 and the second interlayer dielectric layer 330, and then, the upper contact 350 penetrating through the third interlayer dielectric layer 330 and coupled to the upper end of the variable resistance element 100 may be formed.

In the memory device of this implementation, all layers included in the variable resistance element 100 may have sidewalls aligned with each other. This is because the variable resistance element 100 is formed by an etching process using a single mask.

However, unlike the implementation of FIG. 3, a portion of the variable resistance element 100 and a remaining portion of the variable resistance element 100 may be patterned individually. This will be exemplarily shown in FIG. 4.

Figure 4:
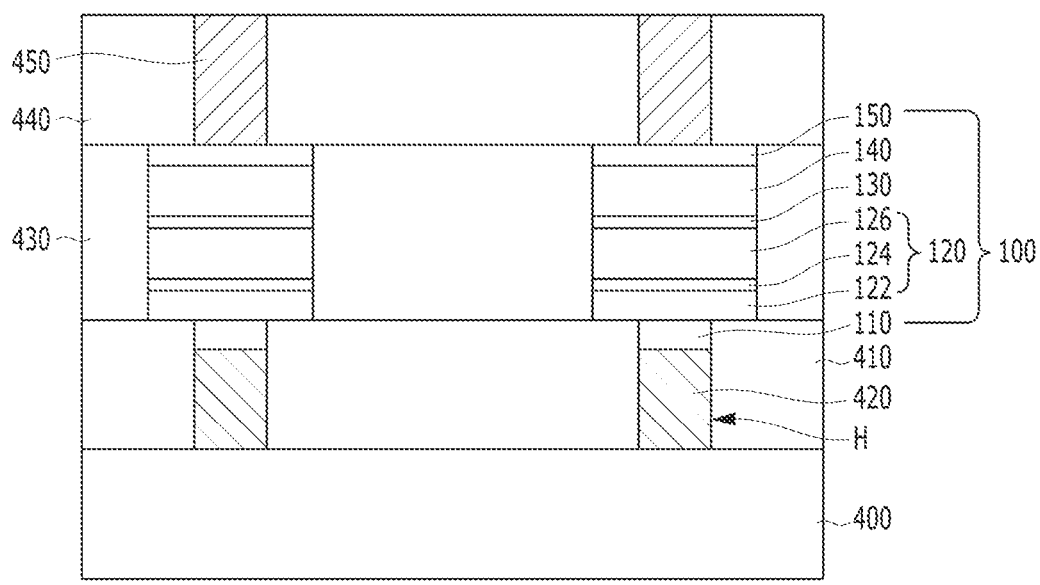
FIG. 4 is a cross-sectional view explaining a memory device in accordance with another implementation of the present disclosure.

FIG. 4 is a cross-sectional view of an exemplary memory device. Referring to FIG. 4, an exemplary method for fabricating the same is also explained in accordance with another implementation of the present disclosure. Differences from the implementation of FIG. 3 will be mainly described.

Referring to FIG. 4, in the memory device of this implementation, a portion of the variable resistance element 100, for example, an under layer 110, may have a sidewall which is not aligned with sidewalls of remaining layers of the variable resistance element 100. The under layer 110 may have a sidewall which is aligned with a sidewall of a lower contact 420.

The above memory device may be fabricated by following processes.

First, a first interlayer dielectric layer 410 may be formed over a substrate 400, and then, a hole H exposing a portion of the substrate 400 may be formed by selectively etching the first interlayer dielectric layer 410. Then, the lower contact 420 filled in a lower portion of the hole H may be formed. Specifically, the lower contact 420 may be formed by forming a conductive material covering a resultant structure in which the hole H is formed, and removing a portion of the conductive material by an etch back process, etc, until the conductive material has a target height. Then, the under layer 110 filled in a remaining space of the hole H in which the lower contact 420 is formed may be formed. For example, the under layer 110 may be formed by forming a material layer which includes a light metal and covers a resultant structure in which the lower contact 420 is formed, and performing a planarization process, for example, a CMP (Chemical Mechanical Polishing) process until a top surface of the first interlayer dielectric layer 410 is exposed. Then, the remaining portion of the variable resistance element 100 may be formed by forming material layers for the remaining layers of the variable resistance element 100, except for the under layer 110, and selectively etching the material layers. Following processes are substantially same as those in the implementation of FIG. 3.

In this implementation, since a thickness to be etched for forming the variable resistance element 100 decreases, a difficulty of an etching process may be reduced.

Also, in this implementation, it has been described that only the under layer 110 is filled in the hole H. However, other implementations are also possible. For example, another portion of the variable resistance element 100 such as the first ferromagnetic material 122, the spacer 124, or the free layer 120, etc, may be also filled in the hole H.

The above and other memory circuits or semiconductor devices based on the disclosed technology can be used in a range of devices or systems. FIGS. 5 to 9 provide some examples of devices or systems that can implement the memory circuits disclosed herein.

Figure 5:
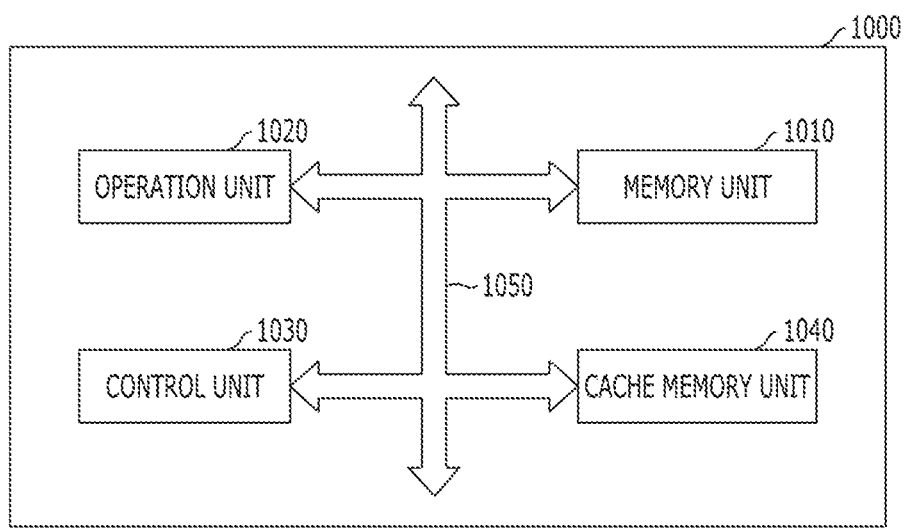
FIG. 5 is an example of configuration diagram of a microprocessor implementing memory circuitry based on the disclosed technology.

FIG. 5 is an example of configuration diagram of a microprocessor implementing memory circuitry based on the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a free layer having a variable magnetization direction; a pinned layer having a pinned magnetization direction; and a tunnel barrier layer interposed between the pinned layer and the free layer, wherein the free layer includes: a first ferromagnetic material; a second ferromagnetic material having a coercive force smaller than that of the first ferromagnetic material; and an amorphous spacer interposed between the first ferromagnetic material and the second ferromagnetic material. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit

1010, the operation unit 1020 and the control unit 1030 through a bus interface 1050.

Figure 6:
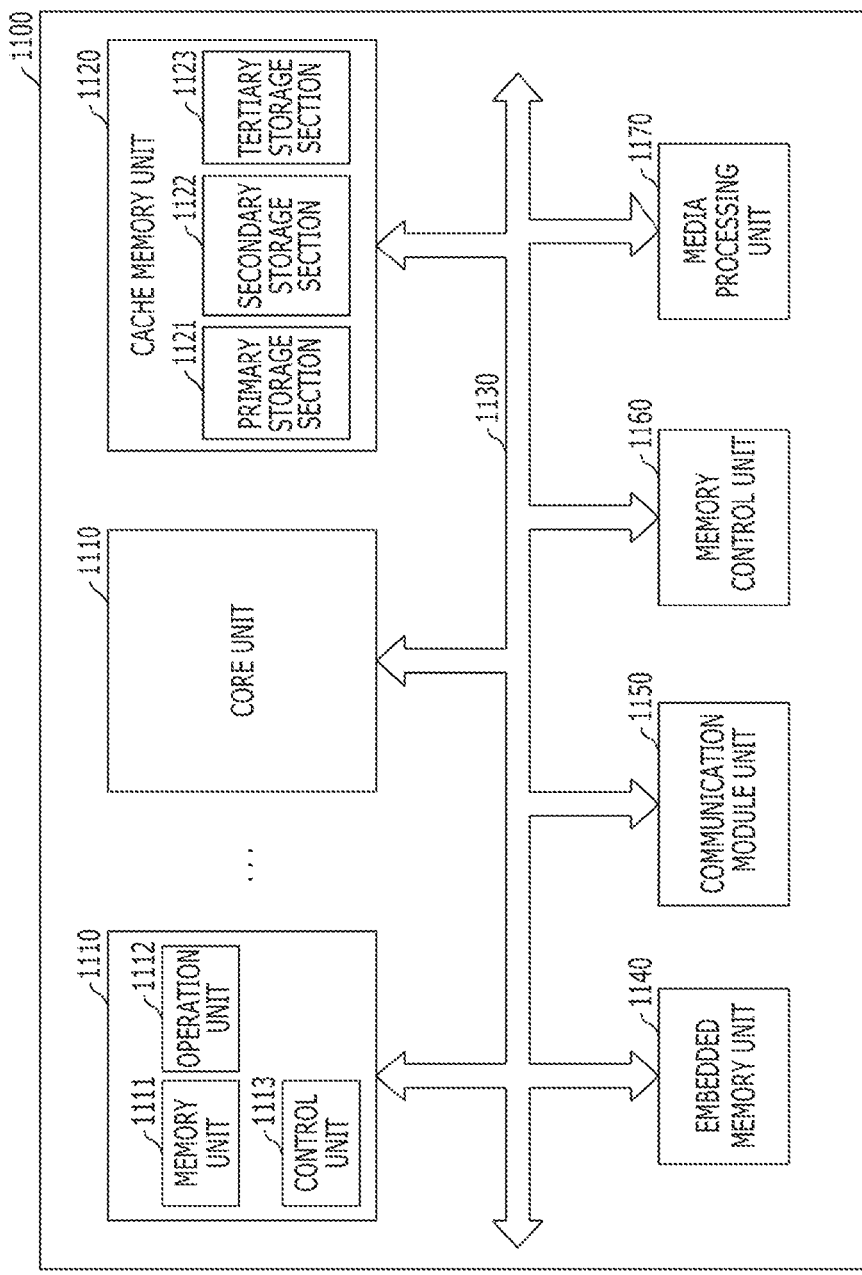
FIG. 6 is an example of configuration diagram of a processor implementing memory circuitry based on the disclosed technology.

FIG. 6 is an example of configuration diagram of a processor implementing memory circuitry based on the disclosed technology.

Referring to FIG. 6, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a free layer having a variable magnetization direction; a pinned layer having a pinned magnetization direction; and a tunnel barrier layer interposed between the pinned layer and the free layer, wherein the free layer includes: a first ferromagnetic material; a second ferromagnetic material having a coercive force smaller than that of the first ferromagnetic material; and an amorphous spacer interposed between the first ferromagnetic material and the second ferromagnetic material. Through this, data storage characteristics of the cache memory unit 1120 may be improved. As a consequence, operating characteristics of the processor 1100 may be improved.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
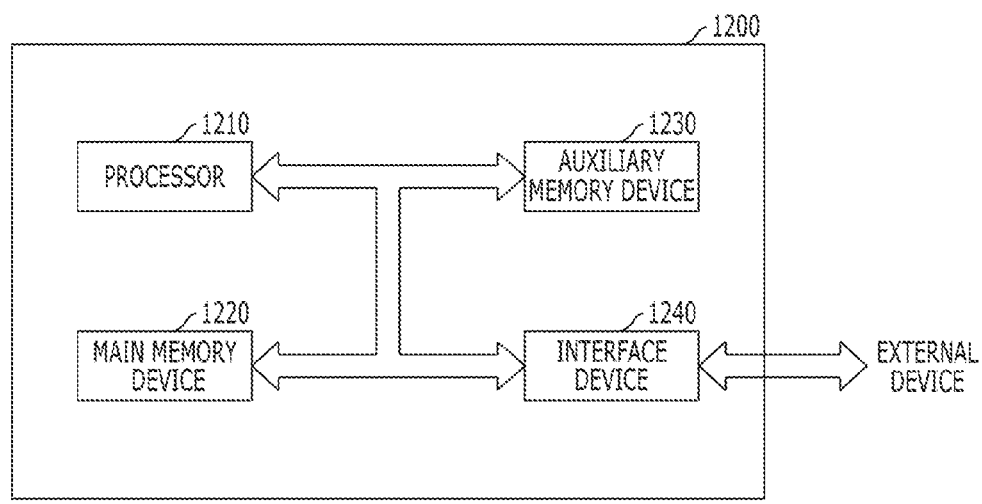
FIG. 7 is an example of configuration diagram of a system implementing memory circuitry based on the disclosed technology.

FIG. 7 is an example of configuration diagram of a system implementing memory circuitry based on the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a free layer having a variable magnetization direction; a pinned layer having a pinned magnetization direction; and a tunnel barrier layer interposed between the pinned layer and the free layer, wherein the free layer includes: a first ferromagnetic material; a second ferromagnetic material having a coercive force smaller than that of the first ferromagnetic material; and an amorphous spacer interposed between the first ferromagnetic material and the second ferromagnetic material. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a free layer having a variable magnetization direction; a pinned layer having a pinned magnetization direction; and a tunnel barrier layer interposed between the pinned layer and the free layer, wherein the free layer includes: a first ferromagnetic material; a second ferromagnetic material having a coercive force smaller than that of the first ferromagnetic material; and an amorphous spacer interposed between the first ferromagnetic material and the second ferromagnetic material. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
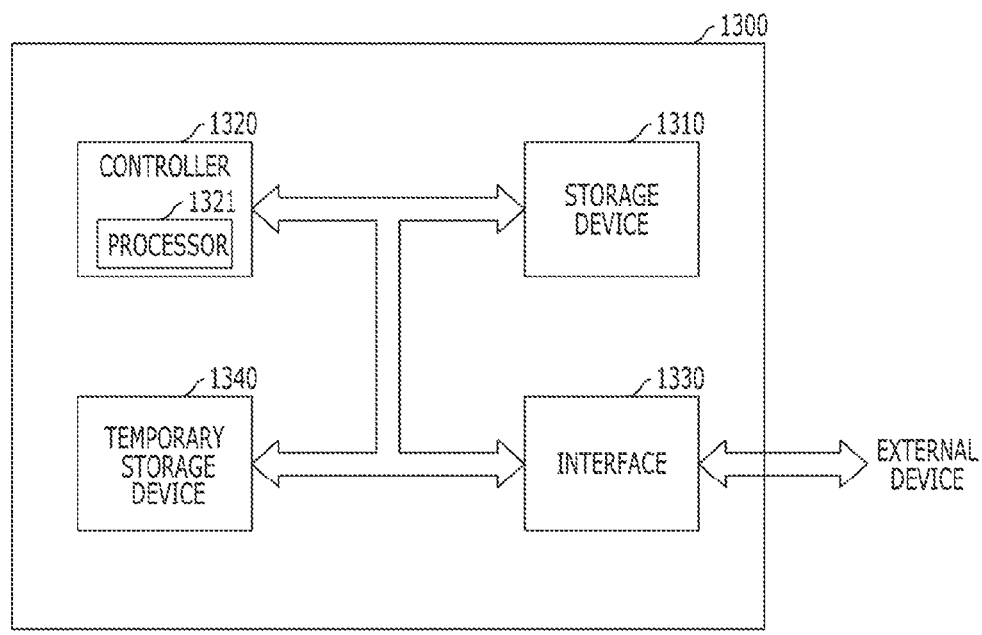
FIG. 8 is an example of configuration diagram of a data storage system implementing memory circuitry based on the disclosed technology.

FIG. 8 is an example of configuration diagram of a data storage system implementing memory circuitry based on the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a free layer having a variable magnetization direction; a pinned layer having a pinned magnetization direction; and a tunnel barrier layer interposed between the pinned layer and the free layer, wherein the free layer includes: a first ferromagnetic material; a second ferromagnetic material having a coercive force smaller than that of the first ferromagnetic material; and an amorphous spacer interposed between the first ferromagnetic material and the second ferromagnetic material. Through this, data storage characteristics of the storage device 1310 or the temporary storage device 1340 may be improved. As a consequence, operating characteristics and data storage characteristics of the data storage system 1300 may be improved.

Figure 9:
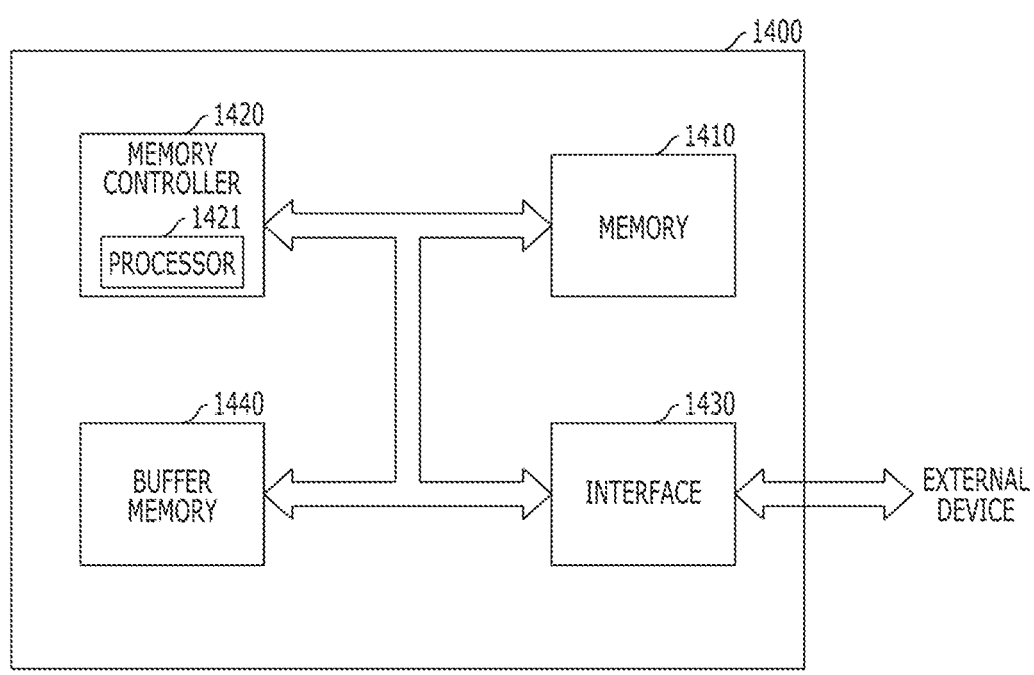
FIG. 9 is an example of configuration diagram of a memory system implementing memory circuitry based on the disclosed technology.

FIG. 9 is an example of configuration diagram of a memory system implementing memory circuitry based on the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a free layer having a variable magnetization direction; a pinned layer having a pinned magnetization direction; and a tunnel barrier layer interposed between the pinned layer and the free layer, wherein the free layer includes: a first ferromagnetic material; a second ferromagnetic material having a coercive force smaller than that of the first ferromagnetic material; and an amorphous spacer interposed between the first ferromagnetic material and the second ferromagnetic material. Through this, data storage characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a free layer having a variable magnetization direction; a pinned layer having a pinned magnetization direction; and a tunnel barrier layer interposed between the pinned layer and the free layer, wherein the free layer includes: a first ferromagnetic material; a second ferromagnetic material having a coercive force smaller than that of the first ferromagnetic material; and an amorphous spacer interposed between the first ferromagnetic material and the second ferromagnetic material. Through this, data storage characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 5-9 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:
1. An electronic device comprising semiconductor memory, wherein the semiconductor memory includes:
a free layer having a variable magnetization direction;

a pinned layer having a pinned magnetization direction; and a tunnel barrier layer interposed between the pinned layer and the free layer, wherein the free layer includes:

a first ferromagnetic material having a coercive force greater than that of Fe;

a second ferromagnetic material including at least one of Co, Ni, Fe, CoFeB, or CoFeGe, the second ferromagnetic material having a coercive force smaller than that of the first ferromagnetic material; and an amorphous spacer interposed between the first ferromagnetic material and the second ferromagnetic material, wherein the tunnel barrier layer is closer to the second ferromagnetic material than the first ferromagnetic material.

2. The electronic device of claim 1, wherein the first ferromagnetic material has a thickness to provide a perpendicular magnetization direction.

3. The electronic device of claim 2, wherein the second ferromagnetic material has a thickness greater than that of the first ferromagnetic material.

4. The electronic device of claim 1, wherein the thickness of the second ferromagnetic material is about 1.5 nm or more.

5. The electronic device of claim 1, wherein the first ferromagnetic material and the second ferromagnetic material have a same magnetization direction to each other.

6. The electronic device of claim 1, wherein the amorphous spacer includes a conductive material.

7. The electronic device of claim 1, wherein the first ferromagnetic material and the second ferromagnetic material have different lattice structures from each other.

8. The electronic device of claim 1, further including a layer disposed under the free layer and including a light metal.

9. The electronic device according to claim 1, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

10. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

11. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

12. The electronic device according to claim 1, further comprising a data storage system which includes:

a storage device configured to store data and conserve stored data regardless of power supply;

a controller configured to control input and output of data to and from the storage device according to a command inputted from an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

13. An electronic device comprising semiconductor memory, wherein the semiconductor memory includes:

an under layer including a light metal;

a free layer disposed over the under layer and having a variable magnetization direction;

a tunnel barrier layer disposed over the free layer; and a pinned layer disposed over the tunnel barrier layer and having a pinned magnetization direction, wherein the free layer is a composite structure which includes:

a first ferromagnetic material including one of FePt, FePd, SmCo, Tb, Bi, Co/Pt, or Co/Pd, the first ferromagnetic material having a first magnetization that can be switched by spin torque transfer and a saturation magnetization smaller than that of the first ferromagnetic material; and a second ferromagnetic material disposed over the first ferromagnetic material and having a coercive force smaller than that of the first ferromagnetic material, wherein exchange coupling between the first and second ferromagnetic materials is allowed so that a magnetization of the second ferromagnetic material is aligned to a magnetization of the first ferromagnetic material and changes with the magnetization of the first ferromagnetic material, wherein the first ferromagnetic material has a coercive force greater than that of Fe and the tunnel barrier layer is closer to the second ferromagnetic material than the first ferromagnetic material.

14. The electronic device of claim 13, wherein the first ferromagnetic material has a thickness to provide a perpendicular magnetization direction.

15. The electronic device of claim 14, wherein the second ferromagnetic material has a thickness greater than that of the first ferromagnetic material.

16. The electronic device of claim 13, wherein the thickness of the second ferromagnetic material is about 1.5 nm or more.

17. The electronic device of claim 13, wherein the first ferromagnetic material and the second ferromagnetic material have a same magnetization direction to each other.

18. The electronic device of claim 13, wherein the free layer further includes:
   an amorphous spacer interposed between the first ferromagnetic material and the second ferromagnetic material.

19. The electronic device of claim 18, wherein the amorphous spacer includes a conductive material.

20. The electronic device of claim 18, wherein the first ferromagnetic material and the second ferromagnetic material have different lattice structures from each other.

* * * * *